United States Patent
Van Lydegraf et al.

(10) Patent No.: US 7,380,050 B2
(45) Date of Patent: May 27, 2008

(54) PARALLEL DATA STORAGE DEVICE

(76) Inventors: Curt N. Van Lydegraf, 11307 Chinden Blvd., Eagle, ID (US) 83714; Tracy A. Sauerwein, 11307 Chinden Blvd., Boise, ID (US) 83714; Donald J. Fasen, 11307 Chinden Blvd., Boise, ID (US) 83714; Richard L. Hilton, 11307 Chinden Blvd., Boise, ID (US) 83714; Craig Raese, 11307 Chinden Blvd., Boise, ID (US) 83714; Michael Clinton Allyn, 11307 Chinden Blvd., Boise, ID (US) 83714; Charles David Smith, 11307 Chinden Blvd., Meridian, ID (US) 83714

( * ) Notice: Subject to any disclaimer, the term of this patent is extended or adjusted under 35 U.S.C. 154(b) by 734 days.

(21) Appl. No.: 11/060,729

(22) Filed: Jan. 31, 2005

(65) Prior Publication Data

US 2006/0174168 A1    Aug. 3, 2006

(51) Int. Cl.
  *G06F 12/00*    (2006.01)

(52) U.S. Cl. .................................................. 711/101
(58) Field of Classification Search ............... None
  See application file for complete search history.

(56) References Cited

U.S. PATENT DOCUMENTS 5,557,596 A    9/1996  Gibson et al.
6,961,299 B2 *  11/2005 Bicknell-Tassius et al. . 369/126

* cited by examiner

*Primary Examiner*—Hiep T Nguyen

(57) ABSTRACT

A parallel data storage device includes a data storage medium having a first cluster and a second cluster. The first cluster includes a first patch and the second cluster includes a second patch. The parallel data storage device also includes a first reader for reading the first patch of the first cluster and a second reader for reading the second patch of the second cluster. A first multiplexer is used for addressing the first cluster while a second multiplexer is used for addressing the second cluster. The first and second readers are arranged in a single column such that the first reader is electrically connected to the first multiplexer and the second reader is electrically connected to the second multiplexer.

20 Claims, 7 Drawing Sheets

600

DETERMINE A NUMBER OF PATCHES THAT FIT ON A DATA STORAGE MEDIUM
602

GROUP THE PATCHES INTO CLUSTERS SUCH THAT EACH CLUSTER INCLUDES A MINIMUM NUMBER OF PATCHES
604

PROVIDE TWO COLUMN LINES IN A SINGLE COLUMN HAVING PATCHES FROM AT LEAST TWO DIFFERENT CLUSTERS
606

*FIG. 6*

PARALLEL DATA STORAGE DEVICE

BACKGROUND

Some portable media storage devices include readers overlying a data storage medium that may move relative to the readers using one or more micro-movers. In some cases, the data storage medium is laid out and the readers are configured such that traditional column/row addressing schemes may be used to address data stored in the data storage medium. However, due to production processes and other considerations, the data storage medium may have an irregular shape leading to an underutilization of an available usable space of the data storage medium when subdivided into rectangular columns and rows. It would thus be desirable to be able to substantially optimize the utilization of the space in the data storage medium.

SUMMARY

As described herein below, a parallel data storage device includes a data storage medium having a first cluster and a second cluster. The first cluster includes a first patch and the second cluster includes a second patch. The parallel data storage device also includes a first reader for reading the first patch of the first cluster and a second reader for reading the second patch of the second cluster. A first multiplexer is used for addressing the first cluster while a second multiplexer is used for addressing the second cluster. The first and second readers are arranged in a single column such that the first reader is electrically connected to the first multiplexer and the second reader is electrically connected to the second multiplexer.

BRIEF DESCRIPTION OF THE DRAWINGS

Examples of the invention are illustrated, without limitation, in the accompanying figures in which like numeral references refer to like elements, and wherein:

FIG. 6 shows a flow diagram of a method for producing a parallel data storage device in accordance with an embodiment of the invention.

DETAILED DESCRIPTION

For simplicity and illustrative purposes, the principles are shown by way of examples of systems and methods described. In the following description, numerous specific details are set forth in order to provide a thorough understanding of the examples. It will be apparent however, to one of ordinary skill in the art, that the examples may be practiced without limitation to these specific details. In other instances, well known methods and structures are not described in detail so as not to unnecessarily obscure understanding of the examples.

In an example, a data storage medium is provided on a movable device. The movable device includes a data storage medium divided into a plurality of clusters having a plurality of patches, each having a plurality of tracks for storing data. A plurality of readers may overlie the data storage medium such that a reader is associated with each patch. As the movable device moves, the plurality of readers traverse the tracks located in the patches and reads data from or writes data to the tracks. This process may be performed in parallel such that one patch from each cluster may be read from or written to simultaneously. This may be accomplished by arranging the patches of each cluster in a row and column matrix such that each cluster includes a minimum number of patches. For instance, the data storage medium may be subdivided so that there are 16 clusters each having 108 patches. In this instance, 16 bits of information may be read from or written to the data storage medium simultaneously.

Examples of the process of reading from and writing to tracks of patches laid out in a cluster may be found may be found in co-pending and commonly assigned U.S. patent application Ser. No. 10/848,392, filed on May 17, 2004, and entitled, "Highly Parallel Data Storage Chip Device," the disclosure of which is hereby incorporated by reference in its entirety.

The data storage medium discussed in the above example may have an irregular shape due to unusable areas caused by manufacturing processes, servo patch layout, and other considerations. Therefore, a rectangular layout of patches into columns and rows may underutilize the available usable space of the data storage medium. In order to read from or write to the data storage medium, as if it were laid out in a rectangular matrix, the readers are wired to multiplexers such that if patches from two different clusters are arranged in a single column a first multiplexer is connected to readers assigned to the patches of a first cluster and a second multiplexer is connected to readers assigned to the patches of a second cluster. This arrangement allows data addresses using column/row addressing schemes even though data may be stored in an irregular fashion, thereby enabling greater utilization of the space available on the data storage medium.

Figure 1:
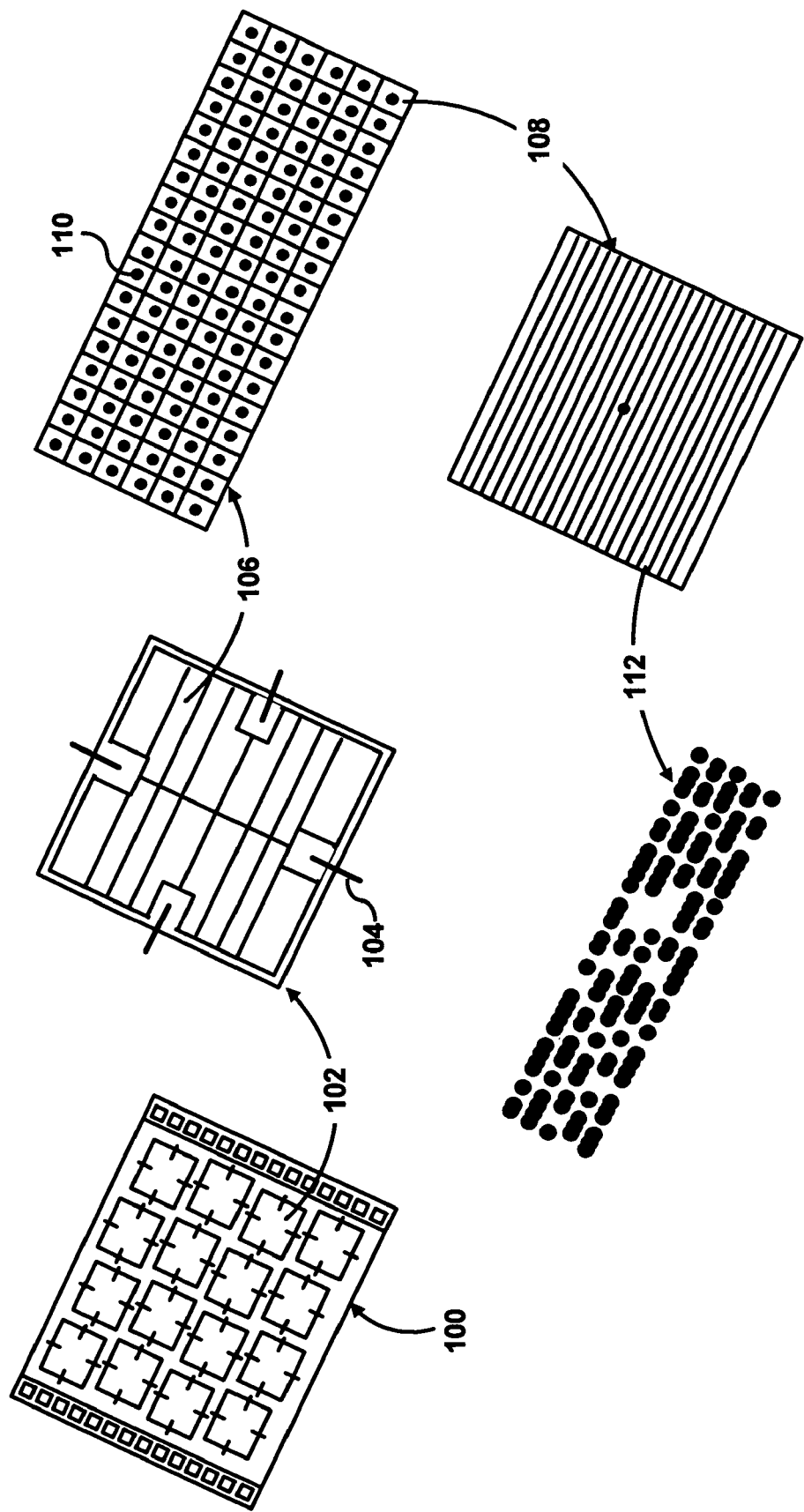
FIG. 1 shows a conceptual diagram of a parallel storage device in accordance with an embodiment of the invention.

With reference first to FIG. 1, there is shown a chip 100 including a data storage portion of a plurality of parallel data storage devices. Each data storage portion includes a micro-mover 102 attached to the chip 100 by springs 104. The springs 104 allow the micro-mover 102 to move for purposes of reading and writing. The micro-mover 102 includes a data storage medium divided into a plurality of clusters 106. Each cluster 106 includes a plurality of patches 108. There may be a reader 110 (and/or writer) associated with each of the patches 108. The patches 108 are illustrated as including a plurality of tracks 112. Data may be written to or read from the tracks using the readers 110.

As shown in FIG. 1, the chip 100 includes sixteen micro-movers 102, each micro-mover 102 includes sixteen clusters 106. The clusters 106 are each illustrated as including one hundred eight patches 108, each patch including one thousand (1000) tracks 112. The depiction of the chip 100 including the aforementioned number of micro-movers 102, clusters 106, patches 108, and tracks 112 is for purposes of illustration and is not to be construed as limiting the chip 100 in any respect. In this regard, the chip 100 may include any reasonably suitable number of micro-movers 102, clusters 106, patches 108, and tracks 112, without departing from a scope of the chip 100 disclosed herein.

The chip 100 generally operates as a storage device configured to store information. The information may include, for instance, instructions or other data that may be processed by a processing system, such as, a computer system. In any regard, the information is stored along the plurality of tracks 112 which run in parallel with each other in each patch 108. A reader 110, such as an electron field emitter, for example, configured to generate an electron beam current and sense diode, is associated with each patch 108 and is configured to read and write information along tracks 112 in a respective patch 108. An example of a suitable reader 110 of this type may be found in commonly assigned U.S. Pat. No. 5,557,596, the disclosure of which is hereby incorporated by reference in its entirety.

The reader 110 may alternatively comprise a cantilever section having a tip configured to also read and write information along tracks 112 in a respective patch 108. An example of suitable read/write mechanism 110 having a cantilevered tip is disclosed in co-pending and commonly assigned U.S. patent application Ser. No. 10/813,477, entitled "Elliptical Shaped Nanoscale Tip", filed on Aug. 9, 2004, which names Donald Fasen et al. as inventors. The disclosure of that patent application is hereby incorporated by reference in its entirety.

Regardless of the type of reader 110 employed in the micro-movers 102, each of the micro-movers 102 includes a plurality of springs 104 configured to allow the micro-mover 102 to move with respect to the reader 110. This allows information to be read and written along each of the tracks 112 in each of the patches 108 in each of the clusters 106 of the micro-mover 102. In this regard, the springs 104 are positioned around the micro-movers 102 to enable the micro-movers 102 to be moved in two dimensions, such that, a single reader 110 may address substantially all of the tracks 112 of a respective patch 108.

Figure 2:
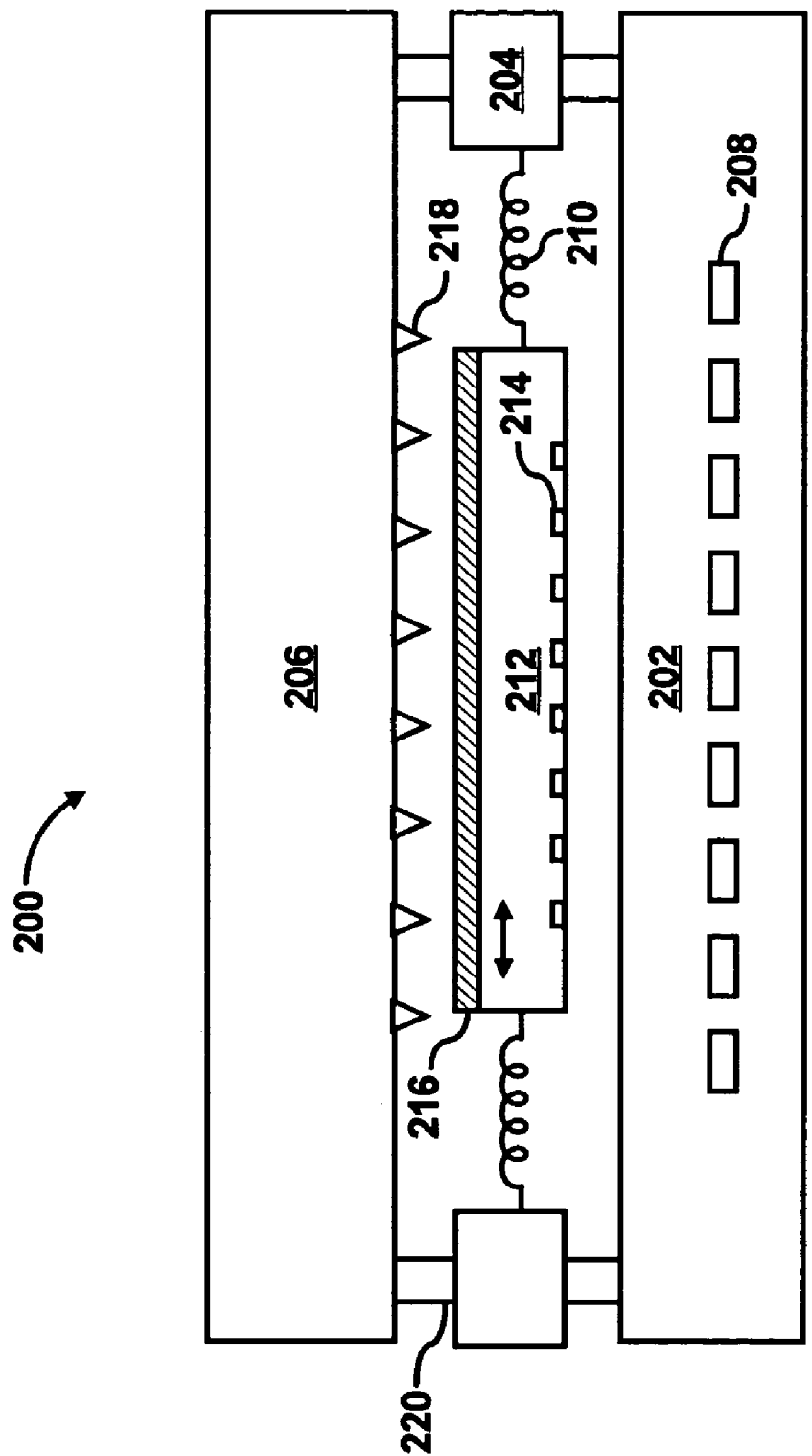
FIG. 2 shows a simplified diagram of a side view of a parallel data storage device in accordance with an embodiment of the invention.

With reference now to FIG. 2, there is shown a simplified cross-sectional diagram of a side elevational view of a parallel data storage device 200 in accordance with an example. The parallel data storage device 200 includes a stator wafer 202, a mover wafer 204, and a read wafer 206. The stator wafer 202 includes stator electrodes 208. The mover wafer 204 includes a micro-mover 212 mounted by springs 210. The micro-mover 212 includes rotor electrodes 214 that interact with the stator electrodes 208, to thus move the micro-mover 212 relative to the read wafer 206. The read wafer 206 includes readers 218 that overlie a data storage medium 216 positioned on the micro-mover 212. As the stator electrodes 208 interact with the rotor electrodes 214 and move the micro-mover 212, the readers 218 of the read wafer 206 read information stored in the data storage medium 216. The readers 218 may also write information into the data storage medium 216. In addition, each reader 218 may operate independently from every other reader 218, in a read mode or a write mode, thus allowing for parallel reads and/or writes of information with movement of the micro-mover 212.

The mover wafer 204 may be hermetically sealed or sandwiched between the read wafer 206 and the stator wafer 202 by seals 220. In this manner, the micro-mover 212 may exist in a controlled environment substantially isolated from other environmental conditions.

Figure 3:
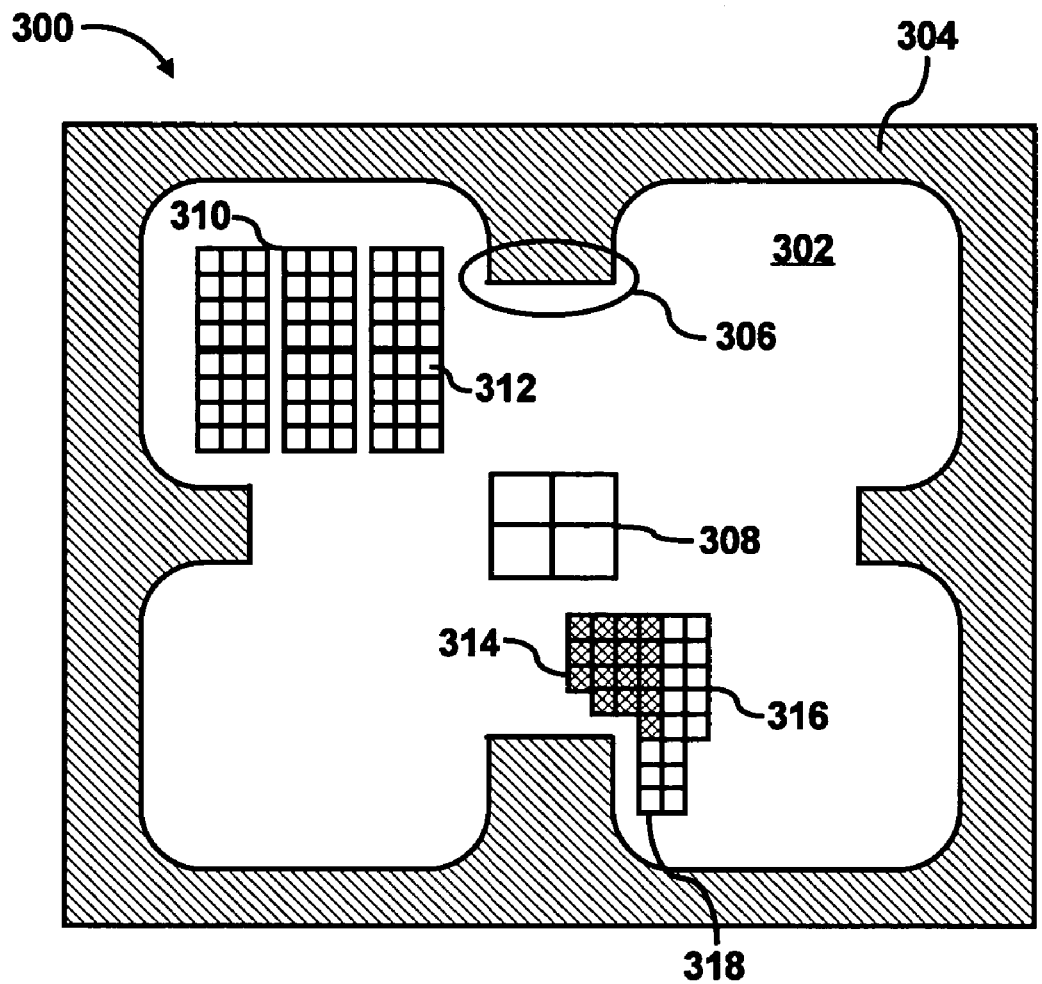
FIG. 3 shows a simplified diagram of a data storage medium in accordance with an embodiment of the invention.

Referring now to FIG. 3, there is shown a simplified diagram of a data storage medium 300 in accordance with an example. The data storage medium 300 includes a usable portion 302 and an unusable portion 304. The usable portion 302 includes parts of the data storage medium 300 that may be reliably written to and read from. The unusable portion 304 includes parts of the data storage medium 300 that, for any number of reasons, may not accept information storage. For example, production processes may have altered a fringe area around edges of the data storage medium 300, thereby making those areas unsuitable for information storage. Additionally, spring attachment points 306 and servo areas 308 may be unusable for data storage. As shown in FIG. 3, the unusable portion 304 reduces the total usable portion 302 and creates obstacles to maximizing storage space of the data storage medium 300.

For example, in parallel reading or writing operational modes, each cluster 310 may be read and/or written in parallel by reading from or writing to a patch 312 associated with each of the clusters 310. Arranging the patches 312 into a rectangular matrix of rows and columns provides a relatively simple way to ensure that the number of patches 312 in each cluster 310 is about equal. However, the unusable portion 304 may have an odd shape and simple rectangular matrices of rows and columns may under utilize the usable portion 302. In order to maximize the usable portion 302, some of the patches 312 of clusters 310 are arranged in a non-rectangular manner.

By way of example, in order to substantially maximize the space between a spring attachment point 306 and a servo area 308, the patches of clusters 314 and 316 are arranged such that the clusters 314 and 316 cover non-rectangular areas. More particularly, some of the patches of the cluster 314, shown with hatch marks, and some of patches of the cluster 316 are in the same row denoted by reference numeral 318. A similar type of arrangement is shown and described in greater detail with respect to FIG. 4 below.

Figure 4:
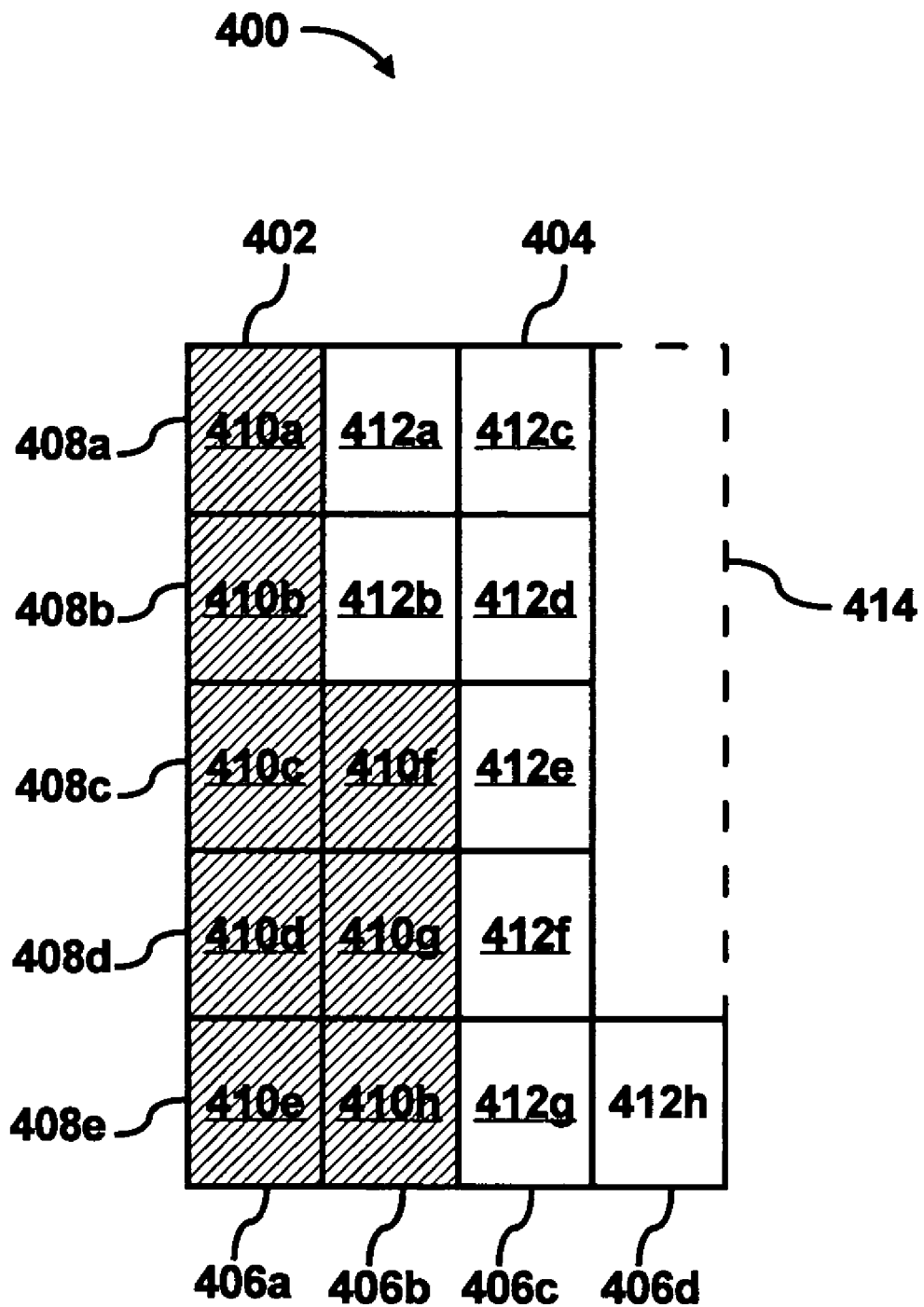
FIG. 4 shows an illustration of portions of a first and second cluster layout in accordance with an embodiment of the invention.

FIG. 4 shows an illustration of portions of a first and second cluster layout 400 in accordance with an example. The layout 400 includes a first cluster 402 and a second cluster 404. The first cluster 402 includes patches labeled 410*a*-410*h*. The second cluster 404 includes patches labeled 412*a*-412*h*. The layout 400 is arranged into columns 406*a*-406*d* and rows 408*a*-408*e*. The column 406*a* includes the patches 410*a*-410*e*, which are all associated with the first cluster 402. The column 406*b*, on the other hand, includes the patches 410*f*-410*h* of the first cluster 402 and the patches 412*a* and 412*b* of the second cluster 404. The column 406*c* includes the patches 412*c*-412*g*, which are all associated with the second cluster 404. Finally, the column 406*d* includes the patch 412*h* of the second cluster and may includes other patches associated with a third cluster in an area 414. Alternatively, the area 414 may be unusable space that prohibits use of the remaining portion of the column 406*d*.

Figure 5:
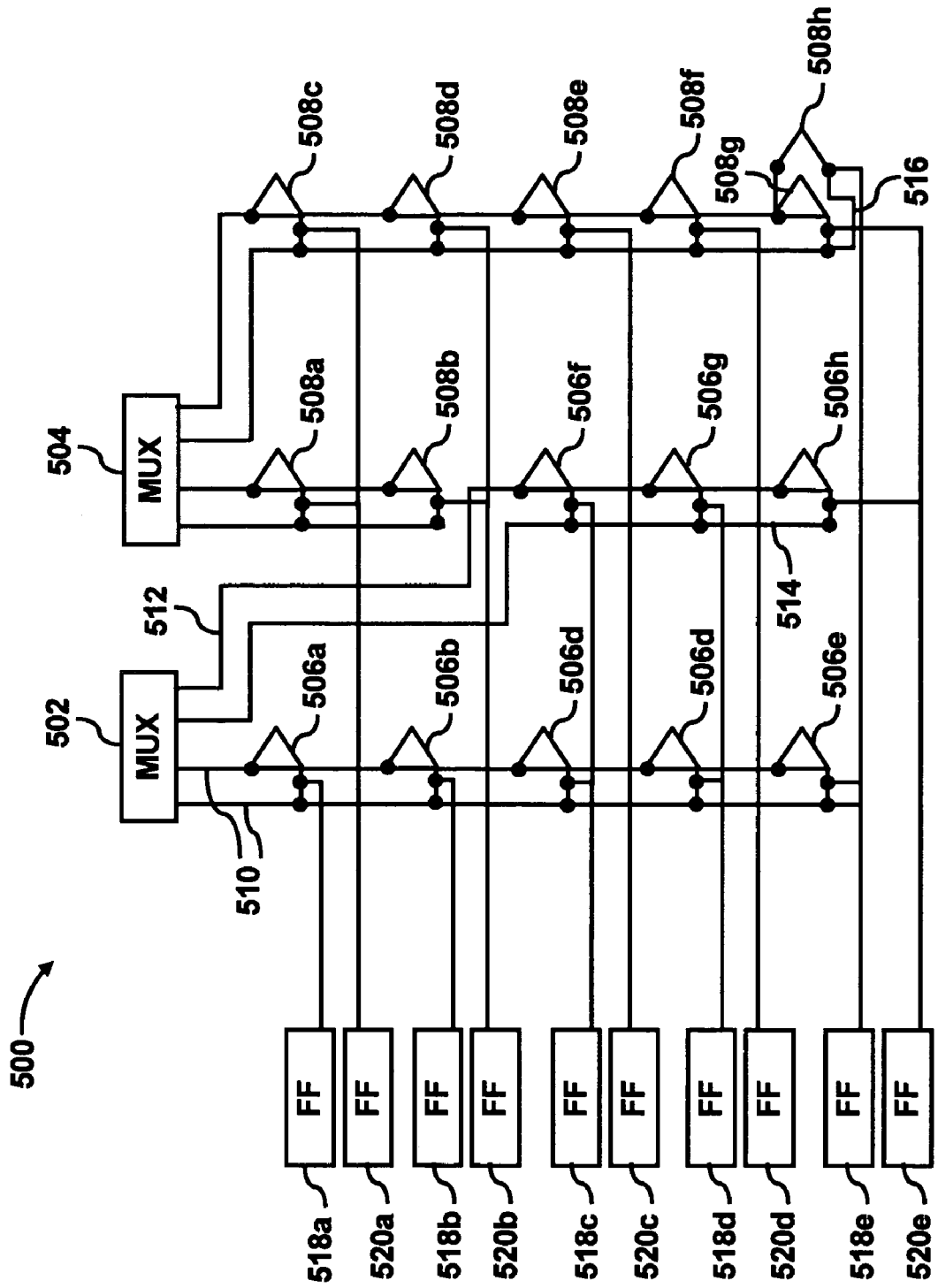
FIG. 5 shows a simplified wiring diagram of a reader in accordance with an embodiment of the invention.

Referring now to FIG. 5, there is shown a simplified wiring diagram 500 of readers, for instance, readers 110, in accordance with an example. The wiring diagram 500 includes a first column multiplexer 502 and a second column multiplexer 504. The first column multiplexer 502 connects to readers 506*a*-506*h*, which are associated with the patches 410*a*-410*h* shown in FIG. 4. The second column multiplexer 504 connects to readers 508*a*-508*h*, which are associated with the patches 412*a*-412*h* shown in FIG. 4. The first column multiplexer 502 connects to readers 506*a*-506*e* through column lines 510 and to readers 506*f*-506*h* through column lines 512. The second column multiplexer 504 connects to readers 508*a* and 508*b* through column lines 514 and to readers 508*c*-508*h* through column lines 516. The column lines 516 extend into an adjacent column for connecting to reader 508*h*. As shown in FIG. 5, although readers 506*f*-506*h* and readers 508*a* and 508*b* are in a single column, they are connected to different column multiplexers.

The wiring diagram 500 also includes circuit activating elements 518*a*-518*e* and 520*a*-520*e*. The circuit activating elements 518*a*-518*e* may be flip-flops for activating a transistor, thus closing a circuit and allowing the first column multiplexer 502 to sense current flowing through (or apply current through) one of the readers 506*a*-506*h* and 508*h* (through the second column multiplexer 504) thus reading or writing information to one of the patches 410*a*-410*h* and 412*h*. The circuit activating elements 520*a*-520*e* may be flip-flops for activating a transistor thus closing a circuit and allowing the second column multiplexer 504 to sense current flowing through (or apply current through) one of the readers 508*a*-508*g* thus reading or writing information to one of the patches 412*a*-412*g*.

FIG. 6 shows a flow diagram of a method 600 for producing a parallel data storage device. The following description of the method 600 is one manner in which the devices may be produced. In this respect, it is to be understood that the following description of the method 600 is but one manner of a variety of different manners in which such a device may be produced.

In the method 600, a number of patches of a predetermined size that will fit on a data storage medium is determined at step 602. The patches are grouped into clusters such that each of the clusters includes a minimum number of patches at step 604. One of the patches of a first one of the clusters and another one of the number of patches of a second one of the clusters may be arranged in a single column as shown, for instance, in FIG. 4. A first column line is provided from a first reader assigned for the at least one patch to a first multiplexer and a second column is provided from a second reader assigned for the at least another patch to a second multiplexer, such that the first and second column lines are assigned to readers associated with the single column, at step 606.

Figure 7:
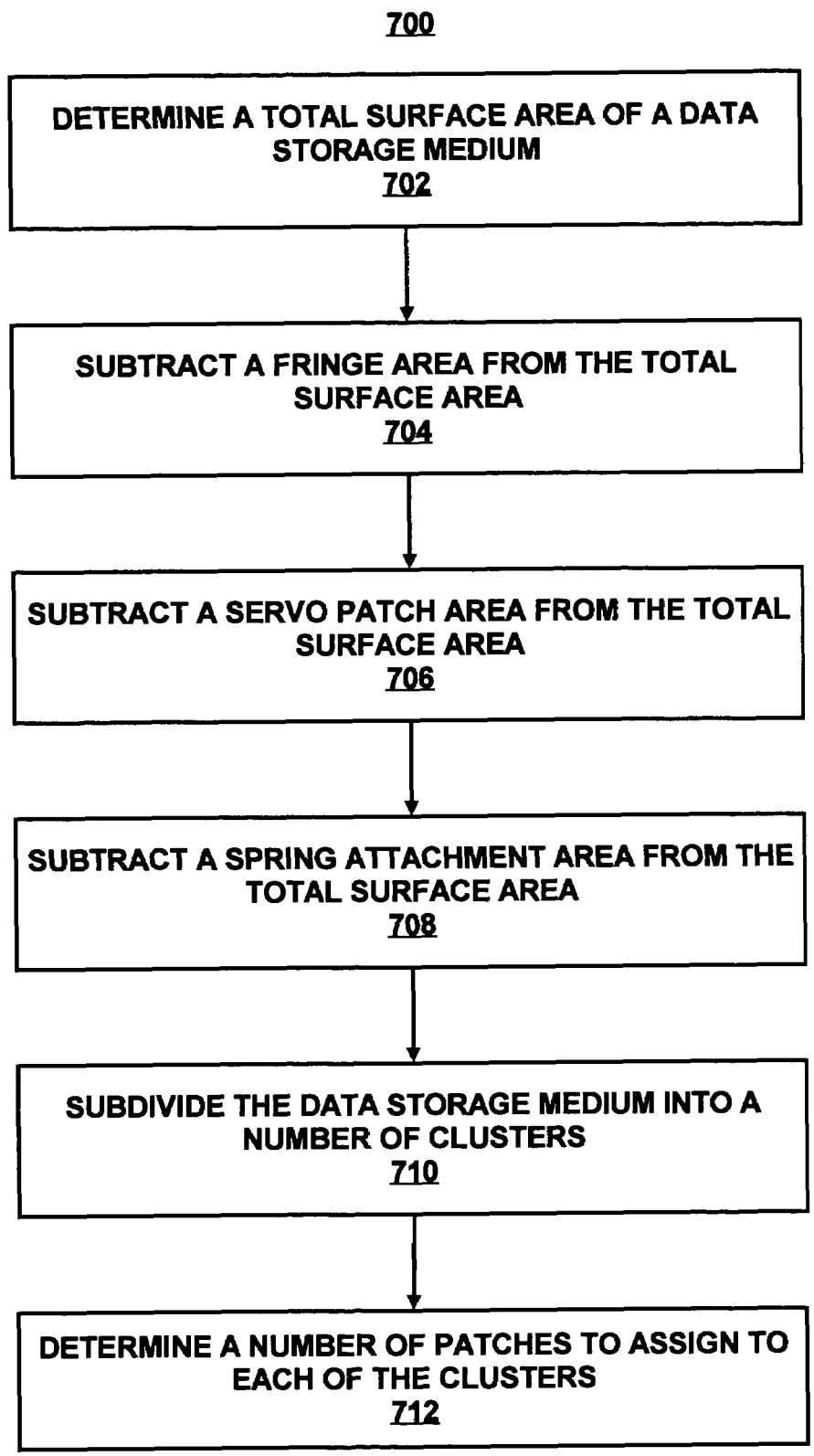
FIG. 7 shows a flow diagram of a method for producing a parallel data storage device in accordance with another embodiment of the invention.

FIG. 7 shows a flow diagram of a method 700 for producing a parallel data storage device. The following description of the method 700 is one manner in which the devices may be produced. In this respect, it is to be understood that the following description of the method 700 is but one manner of a variety of different manners in which such a device may be produced.

In the method 700, a total surface area of a data storage medium is determined at step 702. A fringe area is subtracted from the total surface area at step 704. A servo patch area is also subtracted from the total surface area at step 706. A spring attachment area is subtracted from the total surface area at step 708. These subtractions reduce the total surface area of the data storage medium to a total usable area. The data storage medium is subdivided into a predetermined number of clusters at step 710. The total usable surface area may be divided by an area calculated from the predetermined size of the patches to determine how many patches will fit on the data storage medium. The number of patches is then rounded down to be a whole number multiple of the number of clusters chosen for the data storage medium at step 712.

The patches may then be grouped into clusters such that each of the clusters includes a minimum number of patches. A group of column lines may further be provided for readers associated with the patches of each cluster. A group of activating devices may also be provided for readers associated with the patches of each cluster. If one of the patches of a first one of the clusters and another one of the patches of a second one of the clusters are arranged in a single column, a first column line may be provided from a first reader assigned for the at least one patch to a first multiplexer and a second column may be provided from a second reader assigned for the at least another patch to a second multiplexer, such that the first and second column lines are assigned to readers associated with the single column.

Some of the steps illustrated in the methods 600 and 700 may be performed manually or automatically using a computer program. When performed automatically, the methods 600 and 700 may be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer readable medium, which include storage devices and signals, in compressed or uncompressed form.

Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

What has been described and illustrated herein are examples of the systems and methods described herein along with some of their variations. The terms, descriptions and figures used herein are set forth by way of illustration only and are not meant as limitations. Those skilled in the art will recognize that many variations are possible within the spirit and scope of these examples, which intended to be defined by the following claims and their equivalents in which all terms are meant in their broadest reasonable sense unless otherwise indicated.

What is claimed is:

1. A parallel data storage device comprising:
   a data storage medium having a first cluster and a second cluster, the first cluster including a first patch and the second cluster including a second patch;
   a first reader for reading the first patch of the first cluster;
   a second reader for reading the second patch of the second cluster;
   a first multiplexer for addressing the first cluster; and
   a second multiplexer for addressing the second cluster,
   wherein the first and second readers are arranged in a single column, the first reader is electrically connected to the first multiplexer, and the second reader is electrically connected to the second multiplexer.

2. The device of claim 1, wherein the second cluster includes a third patch, the device further comprising:
   a third reader for reading the third patch of the second cluster, wherein the third reader is located in a second column and electrically connected to the second multiplexer.

3. The device of claim 2, wherein the second and third readers are arranged in a row, the device further comprising:
a first row multiplexer electrically connected to the first reader;
a second row multiplexer electrically connected to the second reader; and
a third row multiplexer electrically connected to the third reader.

4. The device of claim 3, wherein the data storage medium further includes a third cluster having a fourth patch, the device further comprising:
a fourth reader for reading the fourth patch of the third cluster, wherein the fourth reader is located in the row with the third reader and wherein the third row multiplexer is electrically connected to the fourth reader.

5. The device of claim 3, wherein the first, second, and third row multiplexers comprise digital devices.

6. The device of claim 1, wherein the first and second multiplexers comprise analog multiplexers.

7. The device of claim 1, further comprising:
a first plurality of readers electrically connected to the first multiplexer;
a second plurality of readers electrically connected to the second multiplexer,
wherein the first and second plurality of readers are arranged in the column.

8. A method for producing a parallel data storage device, the method comprising:
determining a number of patches of a predetermined size that fit on a data storage medium;
grouping the patches into clusters such that each of the clusters include a minimum number of patches, wherein at least one patch of a first one of the clusters and at least another patch of a second one of the clusters are in a single column; and
providing a first column line from a first reader assigned for the at least one patch to a first multiplexer and a second column line from a second reader assigned for the at least another patch to a second multiplexer, wherein the first and second column lines are assigned to the single column.

9. The method of claim 8, further comprising:
determining a total surface area of the data storage medium;
subtracting a fringe edge area from the total surface area;
subtracting a servo patch area from the total surface area; and
subtracting a spring attachment area from the total surface area to determine a total usable surface area.

10. The method of claim 8, further comprising:
subdividing the data storage medium into a number of clusters; and
determining a number of patches to assign to each of the clusters.

11. The method of claim 8, further comprising:
providing a row line for each of set of readers assigned to read patches in a row of one of the clusters.

12. A parallel data storage device comprising:
a data storage medium having a first cluster and a second cluster, the first cluster including a first patch and the second cluster including a second patch;
a first means for reading the first patch;
a second means for reading the second patch;
means for addressing the first patch and the second patch using the first and second means, respectively, and wherein the first patch and second patch are located in a common column.

13. The device of claim 12, further comprising:
means for activating the first and second means for reading.

14. The device of claim 13, further comprising:
means for multiplexing signals received from the first and second means for reading.

15. A parallel data storage device comprising:
a data storage medium providing a foundation for a plurality of clusters including a plurality of patches having a plurality of tracks for data storage; and
a plurality of readers proximate to the data storage medium such that one of the plurality of readers overlies one of the plurality of tracks of one of the plurality of clusters while another one of the plurality of readers overlies another one of the plurality of tracks of another one of the plurality of clusters,
wherein the plurality of readers are multiplexed such that at least one of the plurality of data patches in at least one of the plurality of data clusters is logically addressed in a column and physically located in another column.

16. The parallel data storage device of claim 15, further comprising:
a first set of multiplexers associated with the one of the plurality of clusters, wherein one of the multiplexers is associated with the column.

17. The parallel data storage device of claim 16, further comprising:
a second set of multiplexers associated with the another one of the plurality of clusters, wherein one of the multiplexers is associated with the column.

18. The parallel data storage device of claim 15, wherein another one of the multiplexers of the second set of multiplexers is associated with the another column.

19. The parallel data storage device of claim 15, further comprising:
a first set of activating devices for activating some of the plurality of readers associated with the first cluster; and
a second set of activating devices for activating some of the plurality of readers associated with the second cluster.

20. The parallel data storage device of claim 19, wherein at least one of the first set of activating devices is configured to activate at least one of the plurality of readers associated with the second cluster.

* * * * *

UNITED STATES PATENT AND TRADEMARK OFFICE
CERTIFICATE OF CORRECTION

PATENT NO. : 7,380,050 B2 Page 1 of 1
APPLICATION NO. : 11/060729
DATED : May 27, 2008
INVENTOR(S) : Curt N. Van Lydegraf et al.

It is certified that error appears in the above-identified patent and that said Letters Patent is hereby corrected as shown below:

On the title page, in field (76), in "Inventors", in column 1, line 2, delete "Eagle, ID" and insert -- Boise, ID --, therefor.

On the title page, in field (76), in "Inventors", in column 1, line 12, delete "Meridian, ID" and insert -- Boise, ID --, therefor.

Signed and Sealed this

Twenty-sixth Day of August, 2008

JON W. DUDAS
*Director of the United States Patent and Trademark Office*